(12) United States Patent
Hwang et al.

(10) Patent No.: US 10,825,880 B2
(45) Date of Patent: Nov. 3, 2020

(54) DISPLAY DEVICE WITH A STORAGE CAPACITOR INCLUDING MULTIPLE DIELECTRIC CONSTANT LAYERS

(71) Applicant: SAMSUNG DISPLAY CO., LTD., Yongin-si, Gyeonggi-Do (KR)

(72) Inventors: Jin Ho Hwang, Osan-si (KR); Byeong-Beom Kim, Asan-si (KR); Chul Min Bae, Hwaseong-si (KR); Woo-Seok Jeon, Seoul (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/143,934

(22) Filed: Sep. 27, 2018

(65) Prior Publication Data

US 2019/0206969 A1 Jul. 4, 2019

(30) Foreign Application Priority Data

Dec. 29, 2017 (KR) .......................... 10-2017-0184507

(51) Int. Cl.
*H01L 27/32* (2006.01)
*G09G 3/32* (2016.01)
(Continued)

(52) U.S. Cl.
CPC .......... *H01L 27/3265* (2013.01); *G09G 3/32* (2013.01); *G09G 3/3225* (2013.01); *G09G 3/3233* (2013.01); *G09G 2300/0842* (2013.01)

(58) Field of Classification Search
CPC .............. G09G 3/32–3291; H01L 27/32–3297
See application file for complete search history.

(56) References Cited

U.S. PATENT DOCUMENTS 8,749,725 B2 * 6/2014 Yoon ................. G02F 1/136213
349/38
9,135,852 B2 * 9/2015 Kwon ................. H01L 27/1251
(Continued)

FOREIGN PATENT DOCUMENTS

KR 10-2009-0019131 2/2009
KR 10-0932321 12/2009
(Continued)

*Primary Examiner* — Gene W Lee
(74) *Attorney, Agent, or Firm* — F. Chau & Associates, LLC

(57) ABSTRACT

A display device includes: a substrate; a semiconductor on the substrate and including a driving channel; a first insulating layer on the semiconductor; a driving gate electrode on the first insulating layer and overlapping the driving channel; a second insulating layer on the driving gate electrode and the first insulating layer and including first and second dielectric constant layers, the second dielectric constant layer having a dielectric constant that is greater than that of the first dielectric constant layer; a storage electrode on the second insulating layer; a passivation layer covering the storage electrode and the second insulating layer; a pixel electrode on the passivation layer; an emission member on the pixel electrode; and a common electrode on the emission member, wherein the storage electrode overlaps the driving gate electrode, and wherein the storage electrode, the driving gate electrode and the second insulating layer therebetween form a storage capacitor.

15 Claims, 11 Drawing Sheets

(51) Int. Cl.
G09G 3/3225 (2016.01)
G09G 3/3233 (2016.01)

(56) References Cited

U.S. PATENT DOCUMENTS

| | | | |
|---|---|---|---|
| 9,178,007 B1 | 11/2015 | Hua et al. | |
| 9,583,557 B2 | 2/2017 | Cheng et al. | |
| 2007/0037352 A1* | 2/2007 | Suzawa | H01L 27/3258 438/282 |
| 2010/0182730 A1 | 7/2010 | Beelen et al. | |
| 2011/0310526 A1 | 12/2011 | Sneh et al. | |
| 2014/0131666 A1* | 5/2014 | Song | H01L 51/5275 257/40 |
| 2016/0118420 A1* | 4/2016 | Yang | H01L 27/1255 257/40 |

FOREIGN PATENT DOCUMENTS

| | | |
|---|---|---|
| KR | 10-2015-0006151 | 1/2015 |
| KR | 10-2015-0111390 | 10/2015 |

* cited by examiner

DISPLAY DEVICE WITH A STORAGE CAPACITOR INCLUDING MULTIPLE DIELECTRIC CONSTANT LAYERS

CROSS-REFERENCE TO RELATED APPLICATION

This application claims priority under 35 U.S.C. § 119 to Korean Patent Application No. 10-2017-0184507 filed in the Korean Intellectual Property Office on Dec. 29, 2017, the disclosure of which is incorporated by reference herein in its entirety.

(a) TECHNICAL FIELD

The present invention relates to a display device, and more particularly, to a display device including a light emitting diode.

(b) DESCRIPTION OF THE RELATED ART

A display device may include two electrodes and an emission member disposed therebetween. In the display device, an electron injected from one electrode and a hole injected from the other electrode are coupled with each other in the emission layer to generate an exciton, which produces energy to emit light. The display device displays a predetermined image by using such emission.

Such a display device may include a plurality of pixels each including a light emitting diode. Furthermore, each pixel may include a plurality of transistors and at least one capacitor for driving the light emitting diode. The transistors of each pixel may include a switching transistor and a driving transistor.

SUMMARY

An exemplary embodiment of the present invention provides a display device including: a substrate; a semiconductor disposed on the substrate, wherein the semiconductor includes a driving channel; a first insulating layer disposed on the semiconductor; a driving gate electrode disposed on the first insulating layer and overlapping the driving channel; a second insulating layer disposed on the driving gate electrode and the first insulating layer, wherein the second insulating layer includes a first dielectric constant layer and a second dielectric constant layer having a dielectric constant that is greater than a dielectric constant of the first dielectric constant layer; a storage electrode disposed on the second insulating layer; a passivation layer covering the storage electrode and the second insulating layer; a pixel electrode disposed on the passivation layer; an emission member disposed on the pixel electrode; and a common electrode disposed on the emission member, wherein the storage electrode overlaps the driving gate electrode, and wherein the storage electrode, the driving gate electrode and the second insulating layer therebetween may form a storage capacitor.

The first dielectric constant layer may be disposed on a gate wire and the first insulating layer, and the second dielectric constant layer may be disposed on the first dielectric constant layer.

The second insulating layer may further include a third dielectric constant layer having a dielectric constant that is smaller than the dielectric constant of the second dielectric constant layer, and the third dielectric constant layer may be disposed on the second dielectric constant layer.

The dielectric constant of the second dielectric constant layer may be equal to or greater than 30, and the dielectric constant of the first dielectric constant layer may be equal to or greater than 6.8 and the dielectric constant of the third dielectric constant layer may be equal to or greater than 6.8.

The second dielectric constant layer may include a zirconium oxide (ZrOx) or a titanium oxide (TiOx), and each of the first dielectric constant layer and the third dielectric constant layer may include a silicon oxide (SiOx), a silicon nitride (SiNx), or an aluminum oxide ($Al_2O_3$).

The second dielectric constant layer may be thicker than each of the first dielectric constant layer and the third dielectric constant layer.

A thickness of the second dielectric constant layer may be in a range of 50 nm to 70 nm, and a sum of a thickness of the first dielectric constant layer and a thickness of the third dielectric constant layer may be in a range of 40 nm to 70 nm.

The second dielectric constant layer may be disposed on a gate wire and the first insulating layer, and the first dielectric constant layer may be disposed on the second dielectric constant layer.

A third dielectric constant layer and a fourth dielectric constant layer may be disposed on the first dielectric constant layer.

A plasma treatment layer may be disposed between the second dielectric constant layer and the first dielectric constant layer.

The display device may further include a third insulating layer, an auxiliary capacitor lower electrode, a fourth insulating layer, and an auxiliary capacitor upper electrode disposed between the passivation layer and the second insulating layer, the third insulating layer may be disposed on the storage electrode and the second insulating layer, the auxiliary capacitor lower electrode may be disposed on the third insulating layer, the fourth insulating layer may be disposed on the auxiliary capacitor lower electrode and the third insulating layer, the auxiliary capacitor upper electrode may be disposed on the fourth insulating layer, and the auxiliary capacitor upper electrode may overlap the auxiliary capacitor lower electrode, and wherein the auxiliary capacitor upper electrode, the auxiliary capacitor lower electrode and the fourth insulating layer therebetween may form an auxiliary capacitor.

The fourth insulating layer may include a fourth dielectric constant layer and a fifth dielectric constant layer having a dielectric constant that is greater than a dielectric constant of the fourth dielectric constant layer.

The fourth insulating layer may further include a sixth dielectric constant layer having a dielectric constant that is smaller than a dielectric constant of the fifth dielectric constant layer, the fourth dielectric constant layer may be disposed on the auxiliary capacitor lower electrode and the third insulating layer, the fifth dielectric constant layer may be disposed on the fourth dielectric constant layer, and the sixth dielectric constant layer may be disposed on the fifth dielectric constant layer.

The dielectric constant of the fifth dielectric constant layer may be equal to or greater than 30, and the dielectric constant of the fourth dielectric constant layer may be equal to or greater than 6.8 and the dielectric constant of the sixth dielectric constant layer may be equal to or greater than 6.8.

The fifth dielectric constant layer may include a zirconium oxide (ZrOx) or a titanium oxide (TiOx), and each of the fourth dielectric constant layer and the sixth dielectric constant layer may include a silicon oxide (SiOx), a silicon nitride (SiNx), or an aluminum oxide ($Al_2O_3$).

The fifth dielectric constant layer may be thicker than each of the fourth dielectric constant layer and the sixth dielectric constant layer.

A thickness of the fifth dielectric constant layer may be in a range of 50 nm to 70 nm, and a sum of a thickness of the fourth dielectric constant layer and a thickness of the sixth dielectric constant layer may be in a range of 40 nm to 70 nm.

The fifth dielectric constant layer may be disposed on the auxiliary capacitor lower electrode and the third insulating layer, and the fourth dielectric constant layer may be disposed on the fifth dielectric constant layer.

A sixth dielectric constant layer and a seventh dielectric constant layer may be disposed on the fourth dielectric constant layer.

A plasma treatment layer may be disposed between the fifth dielectric constant layer and the fourth dielectric constant layer.

An exemplary embodiment of the present invention provides a display device including: a substrate; a first electrode disposed on the substrate; a first low dielectric constant layer disposed on the first electrode; a high dielectric constant layer disposed on the first low dielectric constant layer; a second low dielectric constant layer disposed on the high dielectric constant layer; and a second electrode overlapping the first low dielectric constant layer, the high dielectric constant layer, the second low dielectric constant layer and the first electrode, wherein a storage capacitor is formed by the first electrode, the second electrode and the first low dielectric constant layer, the high dielectric constant layer, and the second low dielectric constant layer between the first electrode and the second electrode.

The first low dielectric constant layer, the high dielectric constant layer and the second low dielectric constant layer may be sequentially arranged.

The first low dielectric constant layer may be disposed directly on the first electrode, and the second electrode may be disposed directly on the second low dielectric constant layer.

A dielectric constant of the high dielectric constant layer may be greater than a dielectric constant of each of the first and second low dielectric constant layers.

An exemplary embodiment of the present invention provides a display device including: a substrate; a first electrode disposed on the substrate; a high dielectric constant layer disposed on the first electrode; a low dielectric constant layer disposed on the high dielectric constant layer; and a second electrode overlapping the low dielectric constant layer, the high dielectric constant layer and the first electrode, wherein a storage capacitor is formed by the first electrode, the second electrode and the low dielectric constant layer and the high dielectric constant layer between the first electrode and the second electrode.

DETAILED DESCRIPTION OF THE EMBODIMENTS

Figure 1:
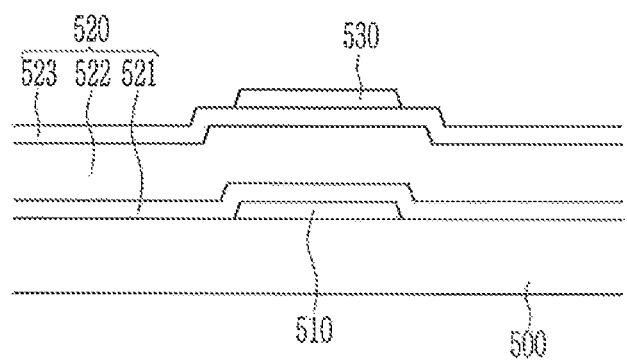
FIG. 1 schematically illustrates a capacitor structure according to an exemplary embodiment of the present invention.

Hereinafter, exemplary embodiments of the present invention will be described more fully hereinafter with reference to the accompanying drawings. As those skilled in the art would realize, the described embodiments may be modified in various different ways, and thus, should not be construed as being limited to the embodiments set forth herein.

Like reference numerals may refer to like or similar elements throughout the specification.

In the drawings, the thicknesses of some layers and areas may be exaggerated.

It will be understood that when an element such as a layer, film, region, or substrate is referred to as being "on" another element, it can be directly on the other element or intervening elements may also be present.

FIG. 1 schematically illustrates a capacitor structure according to an exemplary embodiment of the present invention.

Referring to FIG. 1, a first electrode 510, a dielectric constant layer 520, and a second electrode 530 are sequentially stacked on a substrate 500. The first electrode 510, the dielectric constant layer 520, and the second electrode 530 constitute a capacitor. The dielectric constant layer 520 serves as a dielectric material of the capacitor.

The dielectric constant layer 520 includes a first low dielectric constant layer 521, a high dielectric constant layer 522, and a second low dielectric constant layer 523. The first low dielectric constant layer 521 is disposed on the first electrode 510, the high dielectric constant layer 522 is disposed on the first low dielectric constant layer 521, and the second low dielectric constant layer 523 is disposed on the high dielectric constant layer 522. For example, each of the first low dielectric constant layer 521, the high dielectric constant layer 522, and the second low dielectric constant layer 523 may overlap the first electrode 510.

A dielectric constant of the high dielectric constant layer 522 is greater than a dielectric constant of the first low dielectric constant layer 521 and a dielectric constant of the second low dielectric constant layer 523. The dielectric constants of the first low dielectric constant layer 521 and the second low dielectric constant layer 523 may be identical to or different from each other. The dielectric constant of the high dielectric constant layer 522 may be equal to or greater than 30. The dielectric constants of the first low dielectric constant layer 521 and the second low dielectric constant layer 523 may be equal to or greater than 6.8.

The first low dielectric constant layer 521 and the second low dielectric constant layer 523 may include a silicon oxide (SiOx), a silicon nitride (SiNx), or an aluminum oxide ($Al_2O_3$). The high dielectric constant layer 522 may include zirconium oxide (ZrOx) or titanium oxide (TiOx). The first low dielectric constant layer 521 and the second low dielectric constant layer 523 may include a same material as each other.

The high dielectric constant layer 522 is thicker than each of the first low dielectric constant layer 521 and the second low dielectric constant layer 523. The high dielectric constant layer 522 may also be thicker than a combination of the first low dielectric constant layer 521 and the second low dielectric constant layer 523.

As such, according to the present exemplary embodiment, the capacitor includes a dielectric constant layer having a high dielectric constant and a dielectric constant layer having a low dielectric constant. Accordingly, when the capacitor is applied to a display device that is driven by using a high driving voltage of 7 V or more, the capacitor can reduce a leakage current and increase a breakdown voltage.

Figure 2:
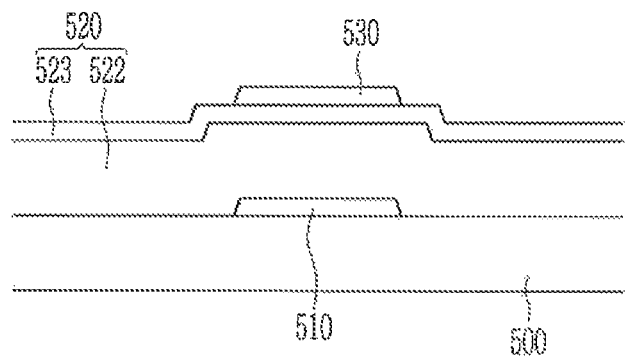
FIG. 2 schematically illustrates a capacitor structure according to an exemplary embodiment of the present invention.

FIG. 2 schematically illustrates a capacitor structure according to an exemplary embodiment of the present invention.

Referring to FIG. 2, in the capacitor according to the present exemplary embodiment, the first low dielectric constant layer 521 is omitted as compared with the capacitor of FIG. 1.

The first electrode 510, the dielectric constant layer 520, and a second electrode 530 are sequentially stacked on the substrate 500. The first electrode 510, the dielectric constant layer 520, and the second electrode 530 constitute a capacitor. The dielectric constant layer 520 serves as a dielectric material of the capacitor. For example, the dielectric constant layer 520 is disposed between the first and second electrodes 510 and 530.

The dielectric constant layer 520 includes the high dielectric constant layer 522 and the second low dielectric constant layer 523. The high dielectric constant layer 522 is disposed on the first electrode 510. For example, the high dielectric constant layer 522 is directly on the first electrode 510. The second low dielectric constant layer 523 is disposed on the high dielectric constant layer 522. For example, the second electrode 520 is directly on the second low dielectric constant layer 523.

The dielectric constant of the high dielectric constant layer 522 may be equal to or greater than 30, and the dielectric constant of the second low dielectric constant layer 523 may be equal to or greater than 6.8. The high dielectric constant layer 522 is thicker than the second low dielectric constant layer 523.

In addition, a plasma treatment layer may be disposed between the high dielectric constant layer 522 and the second low dielectric constant layer 523. The plasma treatment layer may be formed by performing a plasma treatment using ammonia ($NH_3$) gas on a surface of the high dielectric constant layer 522. Such plasma treatment may ameliorate surface roughness of the high dielectric constant layer 522. Since the plasma treatment layer is formed between the high dielectric constant layer 522 and the second low dielectric constant layer 523, the capacitor with the plasma treatment layer can reduce the leakage current and increase the breakdown voltage.

Figure 3:
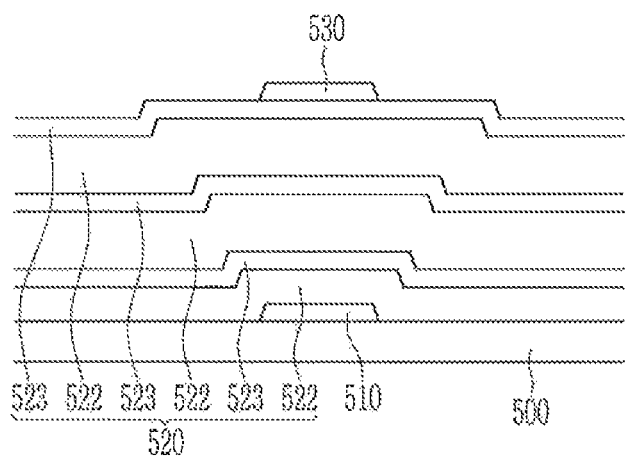
FIG. 3 schematically illustrates a capacitor structure according to an exemplary embodiment of the present invention.

FIG. 3 schematically illustrates a capacitor structure according to an exemplary embodiment of the present invention.

Referring to FIG. 3, a capacitor according to the present exemplary embodiment has a structure in which the high dielectric constant layer 522 and the second low dielectric constant layer 523 are repeatedly formed.

The first electrode 510, the dielectric constant layer 520, and a second electrode 530 are sequentially stacked on the substrate 500. The first electrode 510, the dielectric constant layer 520, and the second electrode 530 constitute a capacitor. The dielectric constant layer 520 serves as a dielectric material of the capacitor.

The dielectric constant layer 520 includes a plurality of high dielectric constant layers 522 and a plurality of second low dielectric constant layers 523. One high dielectric constant layer 522 is disposed on the first electrode 510, and one second low dielectric constant layer 523 is disposed on the high dielectric constant layer 522, and such a stacked structure is repeatedly disposed. In the present exemplary embodiment, the stacked structure of the high dielectric constant layer 522 and the second low dielectric constant layer 523 is repeated three times, but the present invention is not limited thereto. For example, the stacked structure of the high dielectric constant layer 522 and the second low dielectric constant layer 523 may be repeated four or more times.

The dielectric constant of the high dielectric constant layer 522 may be equal to or greater than 30, and the dielectric constant of the second low dielectric constant layer 523 may be equal to or greater than 6.8. The high dielectric constant layer 522 is thicker than the second low dielectric constant layer 523.

Hereinafter, a display device to which a capacitor structure according to an exemplary embodiment of the present invention is applied will be described.

Figure 4:
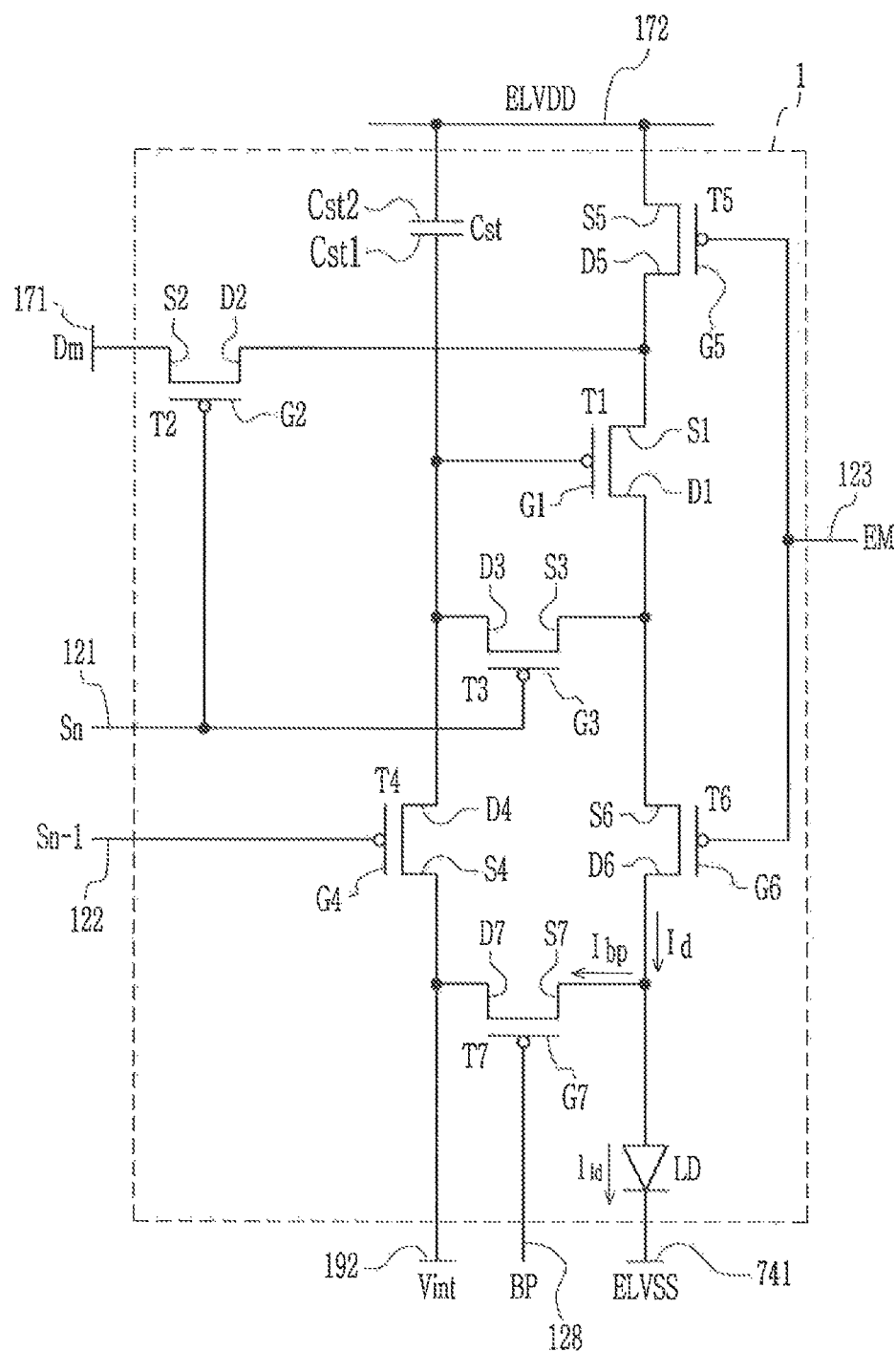
FIG. 4 schematically illustrates an equivalent circuit of one pixel of a display device according to an exemplary embodiment of the present invention.

FIG. 4 schematically illustrates an equivalent circuit of one pixel of a display device according to an exemplary embodiment of the present invention.

Referring to FIG. 4, according to the present exemplary embodiment, one pixel 1 of the display device includes a plurality of signal lines 121, 122, 123, 128, 171, 172, and 192, a plurality of transistors T1, T2, T3, T4, T5, T6, and T7 connected with the signal lines 121, 122, 123, 128, 171, 172, and 192, a storage capacitor Cst, and a light emitting diode LD. The light emitting diode LD may be an organic light emitting diode.

The transistors T1, T2, T3, T4, T5, T6, and T7 include a driving transistor T1, a switching transistor T2, a compensation transistor T3, an initialization transistor T4, an operation control transistor T5, a light emission control transistor T6, and a bypass transistor T7.

The signal lines 121, 122, 123, 128, 171, 172, and 192 include a scan line 121 for transferring a scan signal Sn, a previous-stage scan line 122 for transferring a previous-stage scan signal S(n−1) to the initialization transistor T4, a light emission control line 123 for transferring a light emission control signal EM to the operation control transistor T5 and the light emission control transistor T6, and a bypass control line 128 for transferring a bypass signal BP to the bypass transistor T7. The signal lines 121, 122, 123, 128, 171, 172, and 192 further include a data line 171 crossing the scan line 121 and for transferring a data signal Dm, a driving voltage line 172 for transferring a driving voltage ELVDD and disposed substantially parallel with the data line 171, and an initialization voltage line 192 for transferring an initialization voltage Vint for initializing the driving transistor T1.

A gate electrode G1 of the driving transistor T1 is connected with a first end Cst1 of the storage capacitor Cst, a source electrode S1 of the driving transistor T1 is connected with the driving voltage line 172 via the operation control transistor T5, and a drain electrode D1 of the driving transistor T1 is electrically connected with an anode of the light emitting diode LD via the light emission control transistor T6. The driving transistor T1 receives the data signal Dm according to a switching operation of the switching transistor T2 to supply a driving current Id to the light emitting diode LD.

A gate electrode G2 of the switching transistor T2 is connected with the scan line 121, a source electrode S2 of the switching transistor T2 is connected with the data line 171, and a drain electrode D2 of the switching transistor T2 is connected with the source electrode S1 of the driving transistor T1 and the driving voltage line 172 via the operation control transistor T5. The switching transistor T2 is turned on according to the scan signal Sn received through the scan line 121 to perform a switching operation in which the data signal Dm on the data line 171 is transferred to the source electrode S1 of the driving transistor T1.

A gate electrode G3 of the compensation transistor T3 is connected with the scan line 121, a source electrode S3 of the compensation transistor T3 is connected with the drain electrode D1 of the driving transistor T1 and the anode of the light emitting diode LD via the light emission control transistor T6, and a drain electrode D3 of the compensation transistor T3 is connected with a drain electrode D4 of the initialization transistor T4, the first end Cst1 of the storage capacitor Cst, and the gate electrode G1 of the driving transistor T1. The compensation transistor T3 is turned on according to the scan signal Sn received through the scan line 121 to connect the gate electrode G1 and the drain electrode D1 of the driving transistor T1, thereby diode-connecting the driving transistor T1.

A gate electrode G4 of the initialization transistor T4 is connected with the previous-stage scan line 122, a source electrode S4 of the initialization transistor T4 is connected with the initialization voltage line 192, and the drain electrode D4 of the initialization transistor T4 is connected with the first end Cst1 of the storage capacitor Cst and the gate electrode G1 of the driving transistor T1 via the drain electrode D3 of the compensation transistor T3. The initialization transistor T4 is turned on according to the previous-stage scan signal S(n−1) received through the previous-stage scan line 122. The initialization transistor T4 then transfers the initialization voltage Vint to the gate electrode G1 of the driving transistor T1 and performs an initialization operation by initializing a gate voltage of the gate electrode G1 of the driving transistor T1.

A gate electrode G5 of the operation control transistor T5 is connected with the light emission control line 123, a source electrode S5 of the operation control transistor T5 is connected with the driving voltage line 172, and a drain electrode D5 of the operation control transistor T5 is connected with the source electrode S1 of the driving transistor T1 and the drain electrode S2 of the switching transistor T2.

A gate electrode G6 of the light emission control transistor T6 is connected with the light emission control line 123, a source electrode S6 of the light emission control transistor T6 is connected with the drain electrode D1 of the driving transistor T1 and the source electrode S3 of the compensation transistor T3, and a drain electrode D6 of the light emission control transistor T6 is electrically connected with the anode of the light emitting diode LD. The operation control transistor T5 and the light emission control transistor T6 are simultaneously turned on according to the light emission control signal EM received through the light emission control line 123. When this happens, the driving voltage ELVDD is compensated through the diode-connected driving transistor T1 and transferred to the light emitting diode LD.

A gate electrode G7 of the bypass transistor T7 is connected with the bypass control line 128, a source electrode S7 of the bypass transistor T7 is connected with the drain electrode D6 of the light emission control transistor T6 and the anode of the light emitting diode LD, and a drain electrode D7 of the bypass transistor T7 is connected with the initialization voltage line 192 and the source electrode S4 of the initialization transistor T4.

A second end Cst2 of the storage capacitor Cst is connected with the driving voltage line 172, and a cathode of the light emitting diode LD is connected with a common voltage line 741 for transferring a common voltage ELVSS.

Hereinafter, a detailed operation of one pixel of an organic light emitting diode display device according to an exemplary embodiment of the present invention will be described with reference to FIG. 5.

Figure 5:
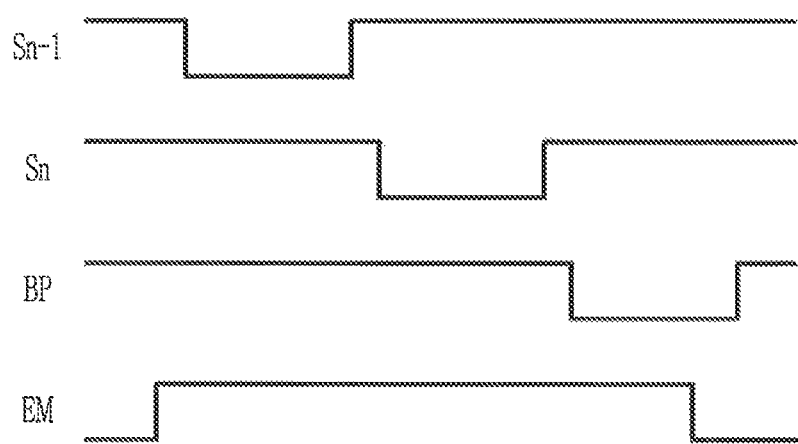
FIG. 5 is a timing diagram of signals applied to one pixel of a display device according to an exemplary embodiment of the present invention.

FIG. 5 is a timing diagram of signals applied to one pixel of a display device according to an exemplary embodiment of the present invention.

As illustrated in FIG. 5, the previous-stage scan signal S(n−1) at a low level is firstly supplied through the previous-stage scan line 122 for an initialization period. Before the previous-stage scan signal S(n−1) of the low level is supplied, the light emission control signal EM at a low level is applied through the light emission control line 123. In response to the previous scan signal S(n−1) at the low level, the initialization transistor T4 is turned on and the initialization voltage Vint is connected from the initialization voltage line 192 to the gate electrode G1 of the driving transistor T1 through the initialization transistor T4. When this happens, the driving transistor T1 is initialized by the initialization voltage Vint.

Thereafter, the scan signal Sn having the low level is supplied through the scan line 121 during a data programming period. The switching transistor T2 and the compensation transistor T3 are turned on in response to the scan signal Sn at the low level. In this case, the driving transistor T1 is diode-connected by the turned-on compensation transistor T3 and biased in a forward direction.

Then, a compensation voltage Dm+Vth (Vth has a negative (−) value), which is reduced from the data signal Dm supplied from the data line 171 by a threshold voltage Vth of the driving transistor T1, is applied to the gate electrode G1 of the driving transistor T1. The driving voltage ELVDD and the compensation voltage Dm+Vth are applied to opposite ends of the storage capacitor Cst. Therefore, a charge corresponding to a voltage difference between the opposite ends of the storage capacitor Cst is stored in the storage capacitor Cst.

Thereafter, for the emission period, the light emission control signal EM supplied from the light emission control line 123 is changed from the high level to the low level.

Subsequently, for the emission period, the operation control transistor T5 and the light emission control transistor T6 are turned on by the light emission control signal EM at the low level.

Then, a driving current Id (see FIG. 4) is generated according to a voltage difference between the gate voltage of the gate electrode G1 of the driving transistor T1 and the driving voltage ELVDD, and the driving current Id is supplied to the light emitting diode LD through the light emission control transistor T6. For a light emission period, a gate-source voltage Vgs of the driving transistor T1 is maintained at '(Dm+Vth)-ELVDD' by the storage capacitor Cst, and according to a current-voltage relationship of the driving transistor T1, the driving current Id is proportional to the square '(Dm-ELVDD)2' of a value obtained by subtracting the threshold voltage Vth from the gate-source voltage Vgs. Accordingly, the driving current Id is determined regardless of the threshold voltage Vth of the driving transistor T1.

In this case, the bypass transistor T7 receives the bypass signal BP from the bypass control line 128. The bypass signal BP is a voltage at a predetermined level which may always turn off the bypass transistor T7. The bypass transistor T7 also receives a voltage at a transistor off level from the gate electrode G7, and thus, the bypass transistor T7 is always turned off. Therefore, a part of the driving current Id flows out through the bypass transistor T7 as a bypass current Ibp in the off state.

When a minimum current of the driving transistor T1 for displaying a black image flows as the driving current Id, and the light emitting diode LD emits light, the black image is not well displayed. Accordingly, the bypass transistor T7 of the organic light emitting diode display device according to the present embodiment may distribute a part of the minimum current of the driving transistor T1 as the bypass current Ibp to a current path other than the current path of the light emitting diode LD side. Herein, the minimum current of the driving transistor T1 may be a current present when the driving transistor T1 is turned off because the gate-source voltage Vgs of the driving transistor T is smaller than the threshold voltage Vth of the driving transistor T1. The minimum driving current (e.g., a current of 10 pA or less) that exists when the driving transistor T1 is turned off is transferred to the light emitting diode LD to be expressed as an image with black luminance. When the minimum driving current for expressing the black image flows, an influence on a bypass transfer of the bypass current Ibp is large, but when a large driving current for expressing an image such as a normal image or a white image flows, there may be little influence on the bypass current Ibp. Accordingly, when the driving current for displaying a black image flows, a light emission current Ild of the light emitting diode LD, which is reduced by the amount of the bypass current Ibp which flows out from the driving current Id through the bypass transistor T7, has a minimum current amount at a level which may precisely express the black image. Therefore, a black luminance image is precisely implemented by using the bypass transistor T7, thereby improving a contrast ratio of a display system.

In FIG. 5, the bypass signal BP is illustrated to be the same as a next scan signal S(n+1), but is not limited thereto. Furthermore, in the exemplary embodiment of FIG. 4, a structure including seven transistors including the bypass transistor T7 and one capacitor is illustrated. However, the numbers of the transistors and the capacitors are not limited thereto and may be varied.

A detailed structure of a display device shown in FIG. 1 will now be described with reference to FIG. 4 and FIG. 6 to FIG. 10.

Figure 6:
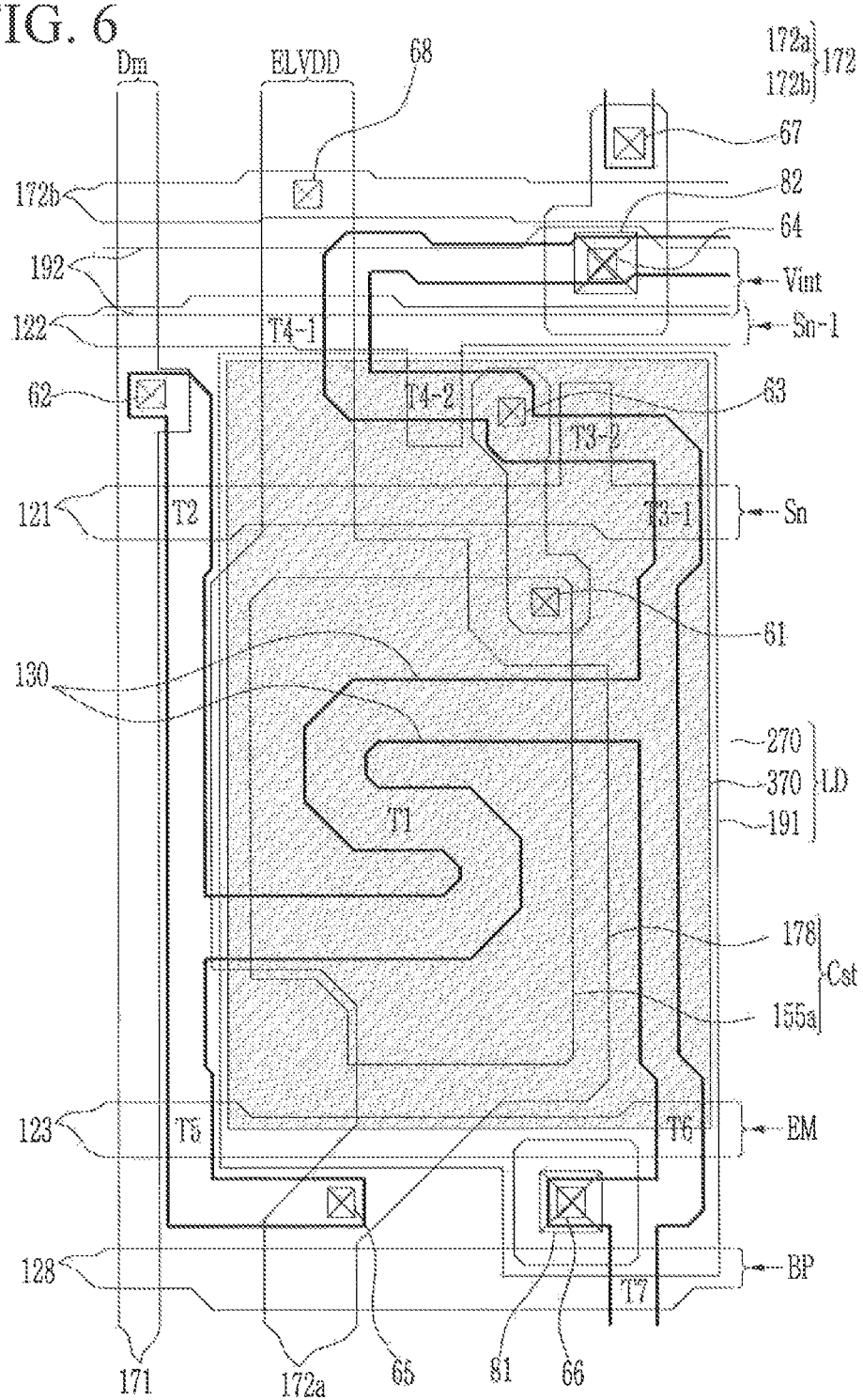
FIG. 6 schematically illustrates a plurality of transistors and a capacitor for a display device according to an exemplary embodiment of the present invention.
Figure 7:
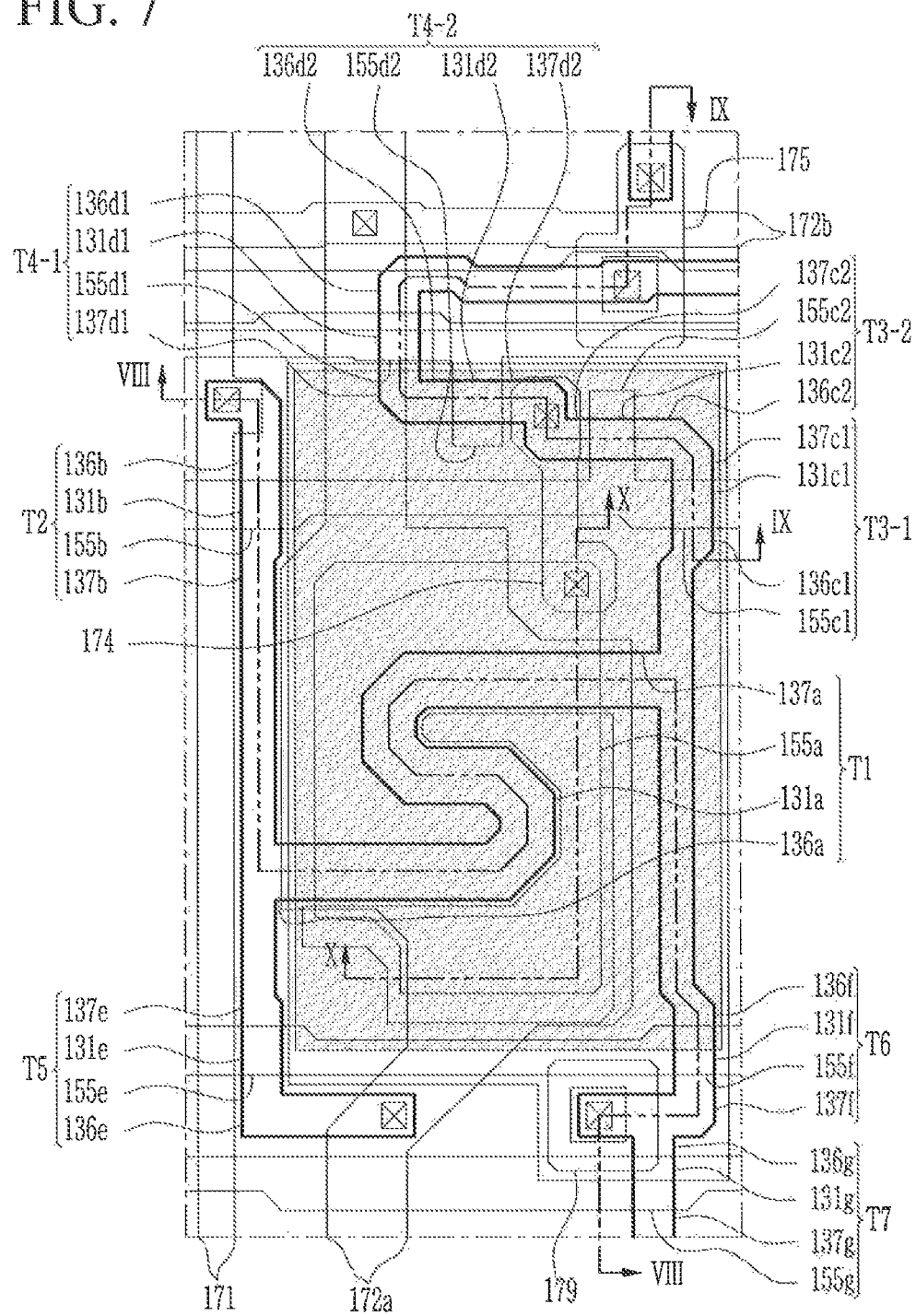
FIG. 7 is a detailed layout view of FIG. 6, according to an exemplary embodiment of the present invention.
Figure 8:
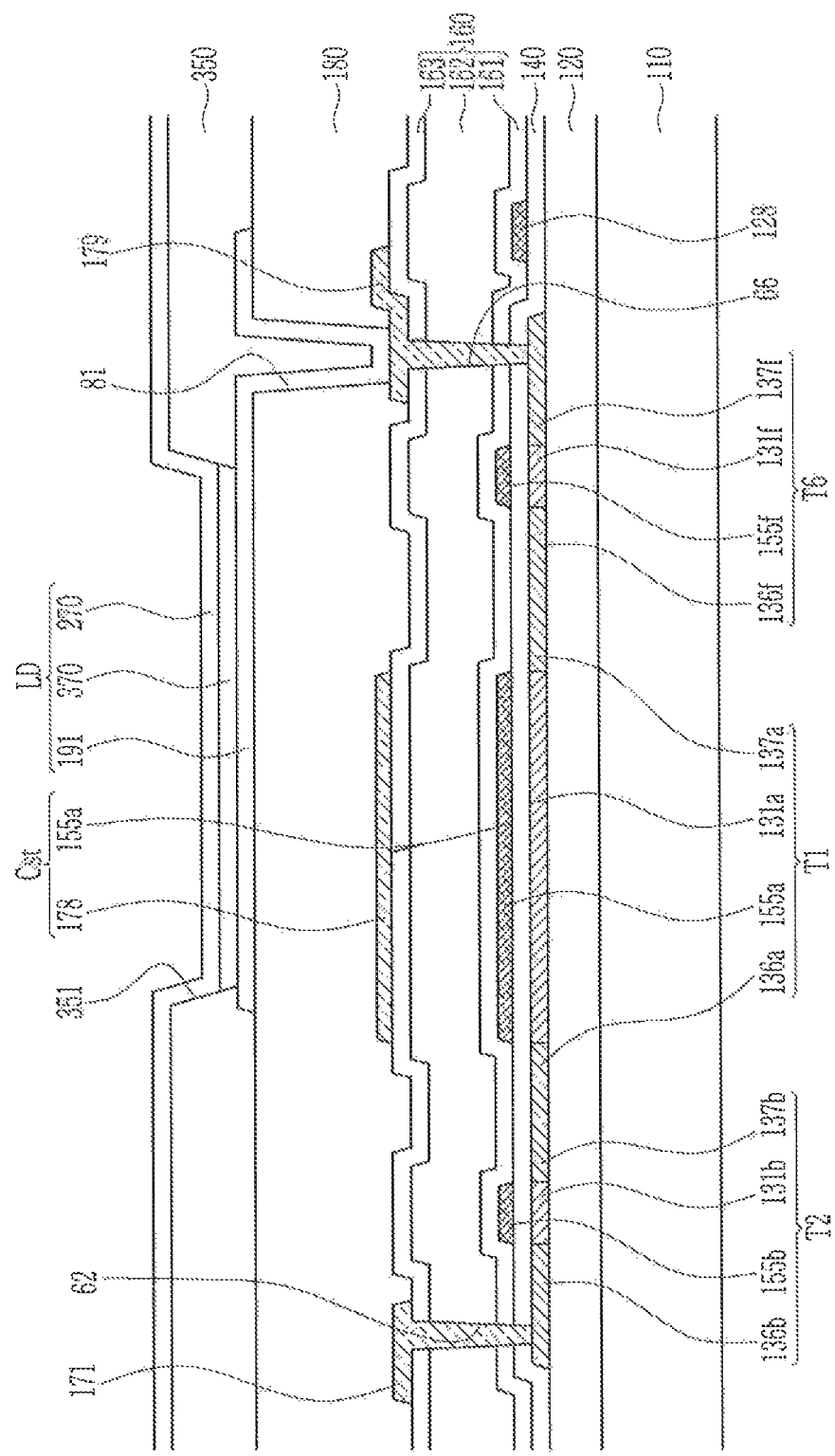
FIG. 8 schematically illustrates a cross-section of the display device of FIG. 7 taken along a line VIII-VIII, according to an exemplary embodiment of the present invention.
Figure 9:
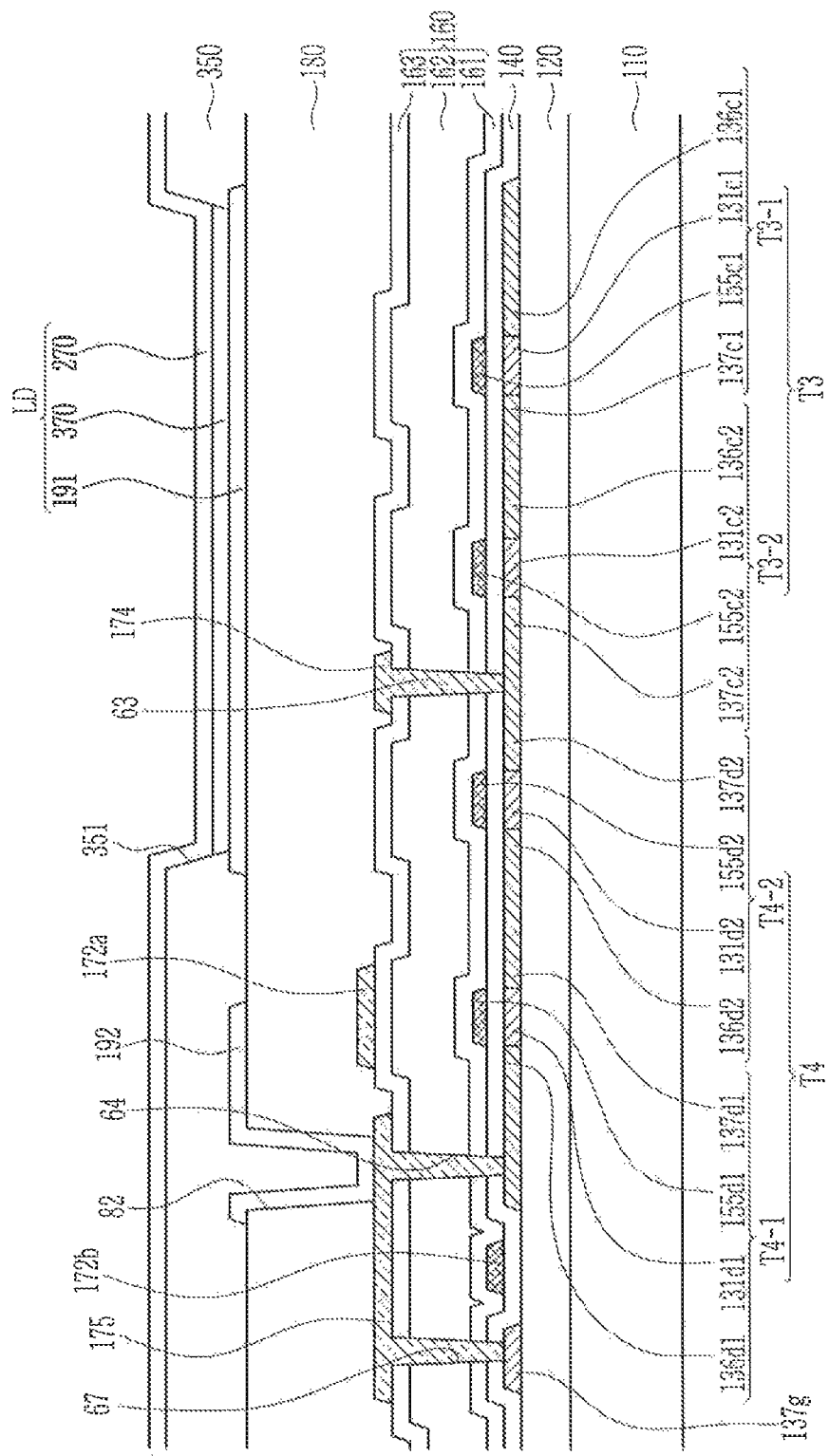
FIG. 9 schematically illustrates a cross-section of the display device of FIG. 4 taken along a line IX-IX, according to an exemplary embodiment of the present invention.
Figure 10:
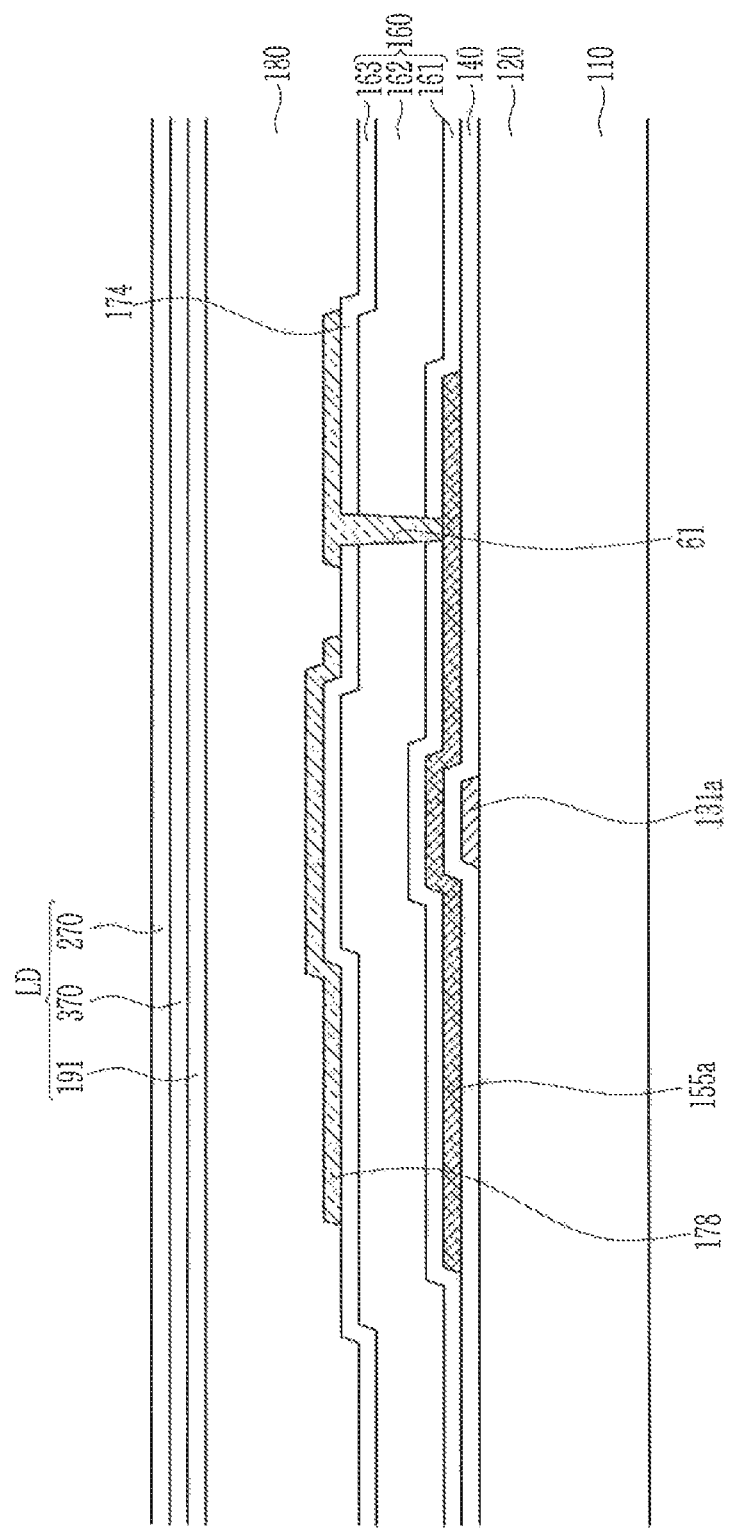
FIG. 10 schematically illustrates a cross-section of the display device of FIG. 4 taken along a line X-X, according to an exemplary embodiment of the present invention.

FIG. 6 schematically illustrates a plurality of transistors and a capacitor of a display device according to an exemplary embodiment of the present invention. FIG. 7 is a detailed layout view of FIG. 6, according to an exemplary embodiment of the present invention. FIG. 8 schematically illustrates a cross-section of the display device of FIG. 7 taken along a line VIII-VIII, according to an exemplary embodiment of the present invention. FIG. 9 schematically illustrates a cross-section of the display device of FIG. 4 taken along a line IX-IX, according to an exemplary embodiment of the present invention. FIG. 10 schematically illustrates a cross-section of the display device of FIG. 4 taken along a line X-X, according to an exemplary embodiment of the present invention.

Hereinafter, a detailed planar structure of the display device according to an exemplary embodiment of the present invention will be first described in detail with reference to FIG. 3 and FIG. 4, and then, a detailed cross-sectional structure of the display device will be described with reference to FIG. 5 to FIG. 8.

Referring to FIG. 6, the display device according to the present exemplary embodiment applies the scan signal Sn, the previous scan signal Sn−1, the light emission control signal EM, and the bypass signal BP, and includes the scan line 121 formed in a row direction, the previous-stage scan line 122, the light emission control line 123, and the bypass control line 128. Further, the display device according to the present exemplary embodiment includes the data line 171 and the driving voltage line 172 which cross the scan line 121, the previous-stage scan line 122, the light emission control line 123, and the bypass control line 128 and apply the data signal Dm and the driving voltage ELVDD to the pixel, respectively.

The initialization voltage Vint is transferred to the compensation transistor T3 through the initialization voltage line 192. The driving voltage line 172 is formed to include a vertical driving voltage line 172a which is parallel with the data line 171 and a horizontal driving voltage line 172b which is parallel with the scan line 121. The vertical driving voltage line 172a and the horizontal driving voltage line 172b are electrically connected to each other through a contact hole 68.

Further, the driving transistor T1, the switching transistor T2, the compensation transistor T3, the initialization transistor T4, the operation control transistor T5, the light emission control transistor T6, the bypass transistor T7, the storage capacitor Cst, and the light emitting diode LD including a pixel electrode 191, an emission member 370, and a common electrode 270 are disposed in the pixel. In this case, the compensation transistor T3 and the initialization transistor T4 are configured as dual gate structure transistors to block a leakage current.

The channel of each of the driving transistor T1, the switching transistor T2, the compensation transistor T3, the initialization transistor T4, the operation control transistor T5, the light emission control transistor T6, and the bypass transistor T7 is disposed inside a semiconductor 130, and the semiconductor 130 can be bent in various shapes. The semiconductor 130 may be made of a polycrystalline semiconductor material or an oxide semiconductor material. In the case where the semiconductor 130 is made of the oxide semiconductor material, a separate passivation layer for protecting the oxide semiconductor material, which is vulnerable to an external environment such as a high temperature, may be added.

The semiconductor 130 includes a channel which is channel-doped with an N-type impurity or a P-type impurity, and a source doping part and a drain doping part which are formed at opposite sides of the channel and doped with an opposite-type doping impurity to the doping impurity of the channel. In the present exemplary embodiment, the source doping part and the drain doping part correspond to the source electrode and the drain electrode, respectively. The source electrode and the drain electrode formed in the semiconductor 130 may be formed by doping only the corresponding regions, e.g., doping only regions at opposite sides of the channel. Further, in the semiconductor 130, a region between source electrodes and drain electrodes of different transistors is doped, and thus, the source electrode and the drain electrode may be electrically connected to each other.

Referring to FIG. 7, the channel includes a driving channel 131a formed in the driving transistor T1, a switching channel 131b formed in the switching transistor T2, first and second compensation channels 131c1 and 131c2 formed in the compensation transistor T3, first and second initialization channels 131d1 and 131d2 formed in the initialization transistor T4, an operation control channel 131e formed in the operation control transistor T5, a light emission control channel 131f formed in the light emission control transistor T6, and a bypass channel 131g formed in the bypass transistor T7.

The driving transistor T1 includes the driving channel 131a, a driving gate electrode 155a, a driving source electrode 136a, and a driving drain electrode 137a. The driving channel 131a is curved and may have a meandering shape or a zigzag shape. As such, by forming the curved driving channel 131a, the driving channel 131a may be formed to be elongated in a narrow space. Accordingly, a driving range of the gate voltage applied to the driving gate electrode 155a is increased by the elongated driving channel 131a. Since the driving range of the gate voltage is increased, a gray scale of light emitted from the light emitting diode LD may be finely controlled by changing the magnitude of the gate voltage. Therefore, the resolution of the organic light emitting diode display device may be enhanced and its display quality may be improved. Various examples such as 'reverse S', 'S', 'M', and 'W' may be implemented by variously modifying the shape of the driving channel 131a.

The driving gate electrode 155a is overlapped with the driving channel 131a. The driving source electrode 136a and the driving drain electrode 137a do not overlap the driving channel 131a.

The switching transistor T2 includes the switching channel 131b, a switching gate electrode 155b, a switching source electrode 136b, and a switching drain electrode 137b. The switching gate electrode 155b, which is a part of the scan line 121 that extends downward, overlaps the switching channel 131b. The switching source electrode 136b and the switching drain electrode 137b do not overlap the switching channel 131b. The switching source electrode 136b is connected with the data line 171 through a contact hole 62 (see FIG. 6).

The compensation transistor T3 includes two compensation transistors to prevent the leakage current. For example, the compensation transistor T3 includes a first compensation transistor T3-1 and a second compensation transistor T3-2 which are adjacent to each other. The first compensation transistor T3-1 is disposed around the scan line 121, and the second compensation transistor T3-2 is disposed around a projection of the scan line 121. The first compensation transistor T3-1 includes the first compensation channel 131c1, a first compensation gate electrode 155c1, a first compensation source electrode 136c1, and a first compensation drain electrode 137c1. The second compensation transistor T3-2 includes the second compensation channel 131c2, a second compensation gate electrode 155c2, a second compensation source electrode 136c2, and a second compensation drain electrode 137c2.

The first compensation gate electrode 155c1, which is a part of the scan line 121, overlaps the first compensation channel 131c1. The first compensation source electrode 136c1 and the first compensation drain electrode 137c1 do not overlap the first compensation channel 131c1. The first compensation source electrode 136c1 is connected with a light emission control source electrode 136f and the driving drain electrode 137a, and the first compensation drain electrode 137c1 is connected with the second compensation source electrode 136c2.

The second compensation gate electrode 155c2, which is a projection protruding upward from the scan line 121, overlaps the second compensation channel 131c2. The second compensation source electrode 136c2 and the second compensation drain electrode 137c2 do not overlap the second compensation channel 131c2. The second compensation drain electrode 137c2 is connected with a first data connection member 174 through a contact hole 63.

The initialization transistor T4 includes two initialization transistors to prevent the leakage current. For example, the initialization transistor T4 includes a first initialization transistor T4-1 and a second initialization transistor T4-2 which are adjacent to each other. The first initialization transistor T4-1 is disposed around the previous-stage scan line 122, and the second initialization transistor T4-2 is disposed around a projection of the previous-stage scan line 122. The first initialization transistor T4-1 includes the first initialization channel 131d1, a first initialization gate electrode 155d1, a first initialization source electrode 136d1, and a first initialization drain electrode 137d1. The second initialization transistor T4-2 includes the second initialization channel 131d2, a second initialization gate electrode 155d2, a second initialization source electrode 136d2, and a second initialization drain electrode 137d2.

The first initialization gate electrode 155d1, which is a part of the previous-stage scan line 122, overlaps the first initialization channel 131d1. The first initialization source electrode 136d1 and the first initialization drain electrode 137d1 do not overlap the first initialization channel 131d1. The first initialization source electrode 136d1 is connected with a second data connection member 175 through a contact hole 64, and the first initialization drain electrode 137d1 is connected with the second initialization source electrode 136d2.

The second initialization gate electrode 155d2, which is a projection protruding downward from the previous-stage scan line 122, overlaps with the second initialization channel 131d2. The second initialization source electrode 136d2 and the second initialization drain electrode 137d2 do not overlap with the second initialization channel 131d2. The second initialization drain electrode 137d2 is connected with the first data connection member 174 through the contact hole 63.

As such, the compensation transistor T3 includes the first compensation transistor T3-1 and the second compensation transistor T3-2, and the initialization transistor T4 includes the first initialization transistor T4-1 and the second initialization transistor T4-2. Therefore, it is possible to efficiently prevent the leakage current from being generated by blocking an electron moving path of the semiconductor 130 in the off state.

The operation control transistor T5 includes the operation control channel 131e, an operation control gate electrode 155e, an operation control source electrode 136e, and an operation control drain electrode 137e. The operation control gate electrode 155e, which is a part of the light emission control line 123, overlaps the operation control channel 131e. The operation control gate electrode 155e does not overlap the operation control source electrode 136e and the operation control drain electrode 137e. The operation control source electrode 136e is connected with a part of the driving voltage line 172 through a contact hole 65.

The light emission control transistor T6 includes the light emission control channel 131f, a light emission control gate electrode 155f, the light emission control source electrode 136f, and a light emission control drain electrode 137f. The light emission control gate electrode 155f, which is a part of the light emission control line 123, overlaps the light emission control channel 131f. The light emission control gate electrode 155f does not overlap the light emission control source electrode 136f and the light emission control drain electrode 137f. The light emission control drain electrode 137f is connected with a third data connection member 179 through a contact hole 66.

The bypass transistor T7 includes the bypass channel 131g, a bypass gate electrode 155g, a bypass source electrode 136g, and a bypass drain electrode 137g. The bypass gate electrode 155g, which is a part of the bypass control line 128, overlaps the bypass channel 131g. The bypass gate electrode 155g does not overlap the bypass source electrode 136g and the bypass drain electrode 137g. The bypass source electrode 136g is directly connected with the light emission control drain electrode 137f, and the bypass drain electrode 137g is connected with the second data connection member 175 through a contact hole 82.

A first end of the driving channel 131a of the driving transistor T1 is connected with the switching drain electrode 137b and the operation control drain electrode 137e, and a second end of the driving channel 131a is connected with the compensation source electrode 136c and the light emission control source electrode 136f.

The storage capacitor Cst includes the driving gate electrode 155a and a storage electrode 178 between which a second insulating layer 160 is disposed (see FIG. 8). The second insulating layer 160 may be a dielectric material of the storage capacitor Cst, and may have a multilayer structure having different dielectric constants. This will be described later.

The storage electrode 178 is an expanded portion of the vertical driving voltage line 172a. One driving gate electrode 155a and one storage electrode 178 may be included in each pixel.

In the storage capacitor Cst, the second insulating layer 160 serves as a dielectric material, and storage capacitance is determined according to a charge accumulated in the storage capacitor Cst by a voltage difference between the driving gate electrode 155a and the storage electrode 178.

The driving gate electrode 155a is connected with the first data connecting member 174 through a contact hole 61. The first data connection member 174 is disposed on the same layer as the data line 171. For example, the first data connection member 174 may be substantially parallel to the data line 171. Further, the first data connection member 174 may connect the driving gate electrode 155a, the second compensation drain electrode 137c2 of the second compensation transistor T3-2, and the second initialization drain electrode 137d2 of the second initialization transistor T4-2.

As a result, the storage capacitor Cst stores a storage capacitance corresponding to a difference between the gate voltage of the driving gate electrode 155a and the driving voltage ELVDD transferred to the storage electrode 178 through the vertical driving voltage line 172a.

Hereinafter, a cross-sectional structure of a display device according to an exemplary embodiment of the present invention will be described in detail according to a stacking order with reference to FIG. 8 to FIG. 10.

In this case, since stacked structures of the operation control transistor T5 and the bypass transistor T7 are mostly the same as those of the light emission control transistor T6, a detailed description thereof may be omitted.

A buffer layer 120 is disposed on a substrate 110. The substrate 110 may include an insulating material such as glass, quartz, ceramic, or plastic. The buffer layer 120 blocks impurities from the insulating substrate 110 during a crystallization process for forming a polycrystalline semiconductor to improve characteristics of the polycrystalline semiconductor and reduce stress applied to the insulating substrate 110.

The semiconductor 130 including the driving channel 131a, the switching channel 131b, the first compensation channel 131c1, the second compensation channel 131c2, the first initialization channel 131d1, the second initialization channel 131d2, and the light emission control channel 131f is disposed on the buffer layer 120. The semiconductor 130 further includes the operation control channel 131e (see FIG. 7) and the bypass channel 131g (see FIG. 7).

In the semiconductor 130, the driving source electrode 136a and the driving drain electrode 137a are disposed at opposite sides of the driving channel 131a, and the switching source electrode 136b and the switching drain electrode 137b are disposed at opposite sides of the switching channel 131b. Additionally, in the semiconductor 130, the first compensation source electrode 136c1 and the first compensation drain electrode 137c1 are disposed at opposite sides of the first compensation channel 131c1, and the second compensation source electrode 136c2 and the second compensation drain electrode 137c2 are disposed at opposite sides of the second compensation channel 131c2. Further, in the semiconductor 130, the first initialization source electrode 136d1 and first initialization drain electrode 137d1 are disposed at opposite sides of the first initialization channel 131d1, and the second initialization source electrode 136d2 and second initialization drain electrode 137d2 are disposed at opposite sides of the second initialization channel 131d2. Furthermore, in the semiconductor 130, the light emission control source electrode 136f and the light emission control drain electrode 137f are disposed at opposite sides of the light emission control channel 131f. In addition, in the semiconductor 130, the operation control source electrode 136e and the operation control drain electrode 137e are disposed at opposite sides of the operation control channel 131e (see FIG. 7), and the bypass source electrode 136g and the bypass drain electrode 137g are disposed at opposite sides of the bypass channel 131g (see FIG. 7).

A first insulating layer 140 is disposed on the semiconductor 130 to cover the semiconductor 130. The first insulating layer 140 may include an insulating material such as a silicon nitride (SiNx) or a silicon oxide (SiOx).

The gate wires 121, 122, 123, 128, 155a, and 172b including the scan line 121 including the switching gate electrode 155b, the first compensation gate electrode 155c1, and the second compensation gate electrode 155c2; the previous-stage scan line 122 including the first initialization gate electrode 155d1 and the second initialization gate electrode 155d2; the light emission control line 123 including the operation gate electrode 155e and the light emission control gate electrode 155f; the bypass control line 128 including the bypass gate electrode 155g; the driving gate electrode (e.g., storage electrode) 155a; and the horizontal driving voltage line 172b are disposed on the first insulating layer 140.

The second insulating layer 160 is disposed to cover the gate wires 121, 122, 123, 128, 155a, and 172b and the first insulating layer 140.

The data wires 171, 172a, 174, 175, 178, and 179 including the data line 171, the vertical driving voltage line 172a including the storage electrode 178, the first data connecting member 174, the second data connecting member 175, and the third data connecting member 179 are disposed on the second insulating layer 160. The storage electrode 178 overlaps the driving gate electrode 155a.

Since the storage electrode 178 is formed on the same layer as the data wires 171, 172a, 174, 175, 178, and 179 by using the same material as that of the vertical driving voltage line 172a and the data line 171, there is no need to form the storage electrode 178 on a different layer by using a different metal. Therefore, it is possible to reduce the number of masks that are used for manufacturing the display device.

The second insulating layer 160 constitutes the storage capacitor Cst together with the driving gate electrode 155a and the storage electrode 178, and the second insulating layer 160 is a dielectric material of the storage capacitor Cst.

The second insulating layer 160 includes a first dielectric constant layer 161, a second dielectric constant layer 162, and a third dielectric constant layer 163. The first dielectric constant layer 161 is disposed on the gate wires 121, 122, 123, 128, 155a, and 172b and the first insulating layer 140, the second dielectric constant layer 162 is disposed on the first dielectric constant layer 161, and the third dielectric constant layer 163 is disposed on the second dielectric constant layer 162. The first dielectric constant layer 161, the second dielectric constant layer 162, and the third dielectric constant layer 163 may respectively correspond to the first low dielectric constant layer 521, the high dielectric constant layer 522, and the second low dielectric constant layer 523 of FIG. 1.

A dielectric constant of the second dielectric constant layer 162 is greater than a dielectric constant of the first dielectric constant layer 161 and a dielectric constant of the third dielectric constant layer 163. The dielectric constant of the first dielectric constant layer 161 and the dielectric constant of the third dielectric constant layer 163 may be identical to or different from each other. The dielectric constant of the second dielectric constant layer 162 may be equal to or greater than 30. The dielectric constant of the first dielectric constant layer 161 and the dielectric constant of the third dielectric constant layer 163 may be equal to or greater than 6.8.

The first dielectric constant layer 161 and the third dielectric constant layer 163 may include a silicon oxide (SiOx), a silicon nitride (SiNx), or an aluminum oxide (Al$_2$O$_3$). The second dielectric constant layer 162 may include a zirconium oxide (ZrOx) or a titanium oxide (TiOx). The first dielectric constant layer 161 and the third dielectric constant layer 163 may include a same material.

Thicknesses of the first dielectric constant layer 161 and the third dielectric constant layer 163 may be identical to or different from each other, and a sum of the thicknesses of the first dielectric constant layer 161 and the third dielectric constant layer 163 may be in a range of 40 nm to 70 nm. The thickness of the second dielectric constant layer 162 may be in a range of 50 nm to 70 nm. Accordingly, the thickness of the second insulating layer 160 may be in a range of 90 nm to 140 nm. The thickness of the second dielectric constant layer 162 is greater than the thickness of the first dielectric constant layer 161 and the thickness of the third dielectric constant layer 163.

In general, the display device is driven at a driving voltage that is higher than 7 V, which increases the capacity of the storage capacitor Cst to reduce the leakage current and improve the breakdown voltage. An increase in the capacitance of the storage capacitor Cst may reduce a thickness of the dielectric material, increase an area of the storage capacitor Cst, or increase a dielectric constant of the dielectric material.

As a resolution of the display device increases, the area of the storage capacitor Cst decreases. Accordingly, there is a limit to how much the thickness of the dielectric can be reduced in view of defects caused by particles or the like.

When, for example, only a dielectric layer having a high dielectric constant is used to increase the dielectric constant of the dielectric material, a leakage current increases. Therefore, such dielectric layer may not be applied to a display device having a high resolution because the breakdown voltage is low.

In the present exemplary embodiment, however, a capacitance of the storage capacitor Cst may be increased, since the second insulating layer 160, which is used as the dielectric material of the storage capacitor Cst, includes a material of a high dielectric constant.

In addition, the leakage current of the display device having the high resolution can be reduced and the breakdown voltage can be increased, since the second insulating layer 160, which is used as the dielectric material of the storage capacitor Cst, includes the first dielectric layer 161 and the third dielectric layer 163 having a low dielectric constant as well as the second dielectric layer 162 having a high dielectric constant.

In the present exemplary embodiment, the structure in which the second insulating layer 160 includes the first dielectric constant layer 161 (e.g., a low dielectric constant layer), the second dielectric constant layer 162 (e.g., a high dielectric constant layer), and the third dielectric constant layer 163 (e.g., a low dielectric constant layer) has been described, but the present invention is not limited thereto. For example, a structure of the capacitor illustrated in FIG. 2 and FIG. 3 may be applied to the second insulating layer 160. For example, the second insulating layer 160 may include just two dielectric layers, e.g., a low dielectric constant layer and a high dielectric constant layer.

The data line 171 is connected with the switching source electrode 136b through the contact hole 62 formed in the first insulating layer 140 and the second insulating layer 160, a first end of the first data connecting member 174 is connected with the driving gate electrode 155a through the contact hole 61 formed at the first insulating layer 140 and the second insulating layer 160, and a second end of the first data connecting member 174 is connected with the second compensation drain electrode 137c2 and the second initialization drain electrode 137d2 through the contact hole 63 formed at the first insulating layer 140 and the second insulating layer 160.

The second data connecting member 175 is connected with the first initialization source electrode 136d1 through the contact hole 64 formed at the first insulating layer 140 and the second insulating layer 160, and is connected with the bypass drain electrode 137g through a contact hole 67 formed at the first insulating layer 140 and the second insulating layer 160. It is possible to prevent transistors from being formed around the horizontal driving voltage line 172b by indirectly connecting the bypass drain electrode 137g and the first initialization source electrode 136d1 with each other through the second data connecting member 175 without directly connecting the bypass drain electrode 137g and the first initialization source electrode 136d1.

Further, the quadrangular-shaped third data connecting member 179 is connected with the light emission control drain electrode 137f through the contact hole 66 formed at the first insulating layer 140 and the second insulating layer 160.

A passivation layer 180 is disposed to cover the data wires 171, 172a, 174, 175, 178, and 179 and the second insulating layer 160. The passivation layer 180 may include an organic layer.

The pixel electrode 191 and the initialization line 192 are disposed on the passivation layer 180. The third data connecting member 179 is connected with the pixel electrode 191 through a contact hole 81 formed at the passivation layer 180, and the second data connecting member 175 is connected with the initialization line 192 through the contact hole 82 formed at the passivation layer 180. The pixel electrode 191 and the initialization voltage line 192 may have a same material.

A pixel definition layer (PDL) 350 covering the passivation layer 180, the initialization voltage line 192, and the pixel electrode 191 is formed on edges of the passivation layer 180, the initialization voltage line 192, and the pixel electrode 191. In addition, the pixel definition layer 350 has a pixel opening 351 that exposes the pixel electrode 191. The pixel definition layer 350 may include a polyacrylate resin, a polyimide resin, or a silica-based inorganic material.

The emission member 370 is disposed on the pixel electrode 191 in the pixel opening 351, and the common electrode 270 is disposed on the emission member 370. Accordingly, the light emitting diode LD including the pixel electrode 191, the emission member 370, and the common electrode 270 is formed.

The pixel electrode 191 may serve as an anode which is a hole injection electrode, and the common electrode 270 may serve as a cathode which is an electron injection electrode. However, the present exemplary embodiment is not limited thereto. For example, the pixel electrode 191 may serve as the cathode and the common electrode 270 may serve as the anode. When holes and electrons are injected into the emission member 370 from the pixel electrode 191 and the common electrode 270, respectively, excitons, which are acquired by combining the injected holes and electrons, fall from an excitation state to a ground state, and thus, light is emitted.

The emission member 370 may include an emission layer, a hole injection layer (HIL), a hole transporting layer (HTL), an electron transporting layer (ETL), or an electron injection layer (EIL). When the emission member 370 includes all of these layers, the hole injection layer is disposed on the pixel electrode 191 which is the positive electrode, and the hole transporting layer, the emission layer, the electron transporting layer, and the electron injection layer are sequentially stacked thereon. The emission layer may include an organic material, or an inorganic material.

The emission member 370 may include a red emission layer for emitting red light, a green emission layer for emitting green light, and a blue emission layer for emitting blue light, and the red emission layer, the green emission layer, and the blue emission layer are formed at a red pixel, a green pixel, and a blue pixel, respectively, to implement color images.

Further, in the emission member 370, all of the red emission layer, the green emission layer, and the blue emission layer may be stacked together on the red pixel, the green pixel, and the blue pixel, and a red color filter, a green color filter, and a blue color filter may be included in each pixel to implement the color images. As an alternative, a white emission layer for emitting white light may be formed on all of the red pixel, the green pixel, and the blue pixel, and the red color filter, the green color filter, and the blue color filter may be included in each pixel to implement the color images. When the color images are implemented by using the white emission layer and the red, green and blue color filters, a deposition mask for depositing the red emission layer, the green emission layer, and the blue emission layer on individual pixels, in other words, the red pixel, the green pixel, and the blue pixel, respectively, may not be used.

The white emission layer may be formed by one emission layer and include a configuration that may emit white light by laminating a plurality of emission layers. As an example, the white emission layer may include a configuration that enables the white light to be emitted by combining at least one yellow emission layer and at least one blue emission layer, combining at least one cyan emission layer and at least one red emission layer, combining at least one magenta emission layer and at least one green emission layer, and the like.

A sealing member for protecting the light emitting diode LD may be disposed on the common electrode 270, and may be sealed on the substrate 110 by using a sealant. The sealing member may be made of various materials such as glass, crystal, ceramic, plastic, and metal. Alternatively, instead of using the sealant, a thin film sealing layer may be formed by depositing an inorganic layer and an organic layer on the common electrode 270.

Hereinafter, a display device according to another exemplary embodiment of the present invention will be described with reference to FIG. 11 and FIG. 12.

Figure 11:
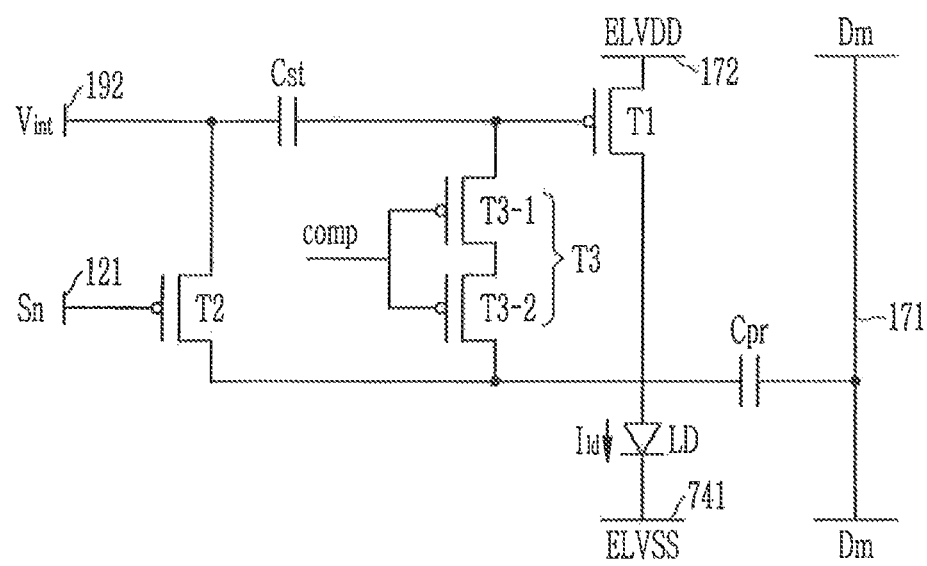
FIG. 11 schematically illustrates an equivalent circuit of one pixel of a display device according to an exemplary embodiment of the present invention.

FIG. 11 schematically illustrates an equivalent circuit of one pixel of a display device according to an exemplary embodiment of the present invention.

Referring to FIG. 11, one pixel of the display device according to the present exemplary embodiment includes a plurality of signal lines 121, 171, 172, and 192, a plurality of transistors T1, T2, and T3 connected with the signal lines 121, 171, 172, and 192, a storage capacitor Cst, an auxiliary capacitor Cpr, and a light emitting diode LD.

The transistors T1, T2, and T3 include a driving transistor T1, a switching transistor T2, and a compensation transistor T3.

The signal lines 121, 171, 172, and 192 includes a scan line 121 for transferring a scan signal Sn, a data line 171 for transferring a data signal Dm, a driving voltage line 172 for transferring a driving voltage ELVDD, and an initialization voltage line 192 for transferring an initialization voltage Vint to initialize the driving transistor T1.

Among three terminals of the driving transistor T1, a first terminal is connected with a first end of the storage capacitor Cst, a second terminal is connected with the driving voltage line 172, and a third terminal is connected to an anode of the light emitting diode LD.

Among three terminals of the switching transistor T2, a first terminal is connected with the scan line 121, a second terminal is connected with a first end of the auxiliary capacitor Cpr, and a third terminal is connected with a second end of the storage capacitor Cst.

The compensation transistor T3 includes a first compensation transistor T3-1 and a second compensation transistor T3-2. A first terminal of each of the first compensation transistor T3-1 and the second compensation transistor T3-2 is connected with a compensation control line comp.

A second terminal of the first compensation transistor T3-1 is connected with the first end of the storage capacitor Cst together with the first terminal of the driving transistor T1, and a third terminal of the first compensation transistor T3-1 is connected with a second terminal of the second compensation transistor T3-2. A third terminal of the second compensation transistor T3-2 is connected with the first end of the auxiliary capacitor Cpr.

The second end of the storage capacitor Cst is connected with the initialization voltage line 192, the second end of the auxiliary capacitor Cpr is connected with the data line 171, and a cathode of the light emitting diode LD is connected with the common voltage line 741 for transferring the common voltage ELVSS.

Figure 12:
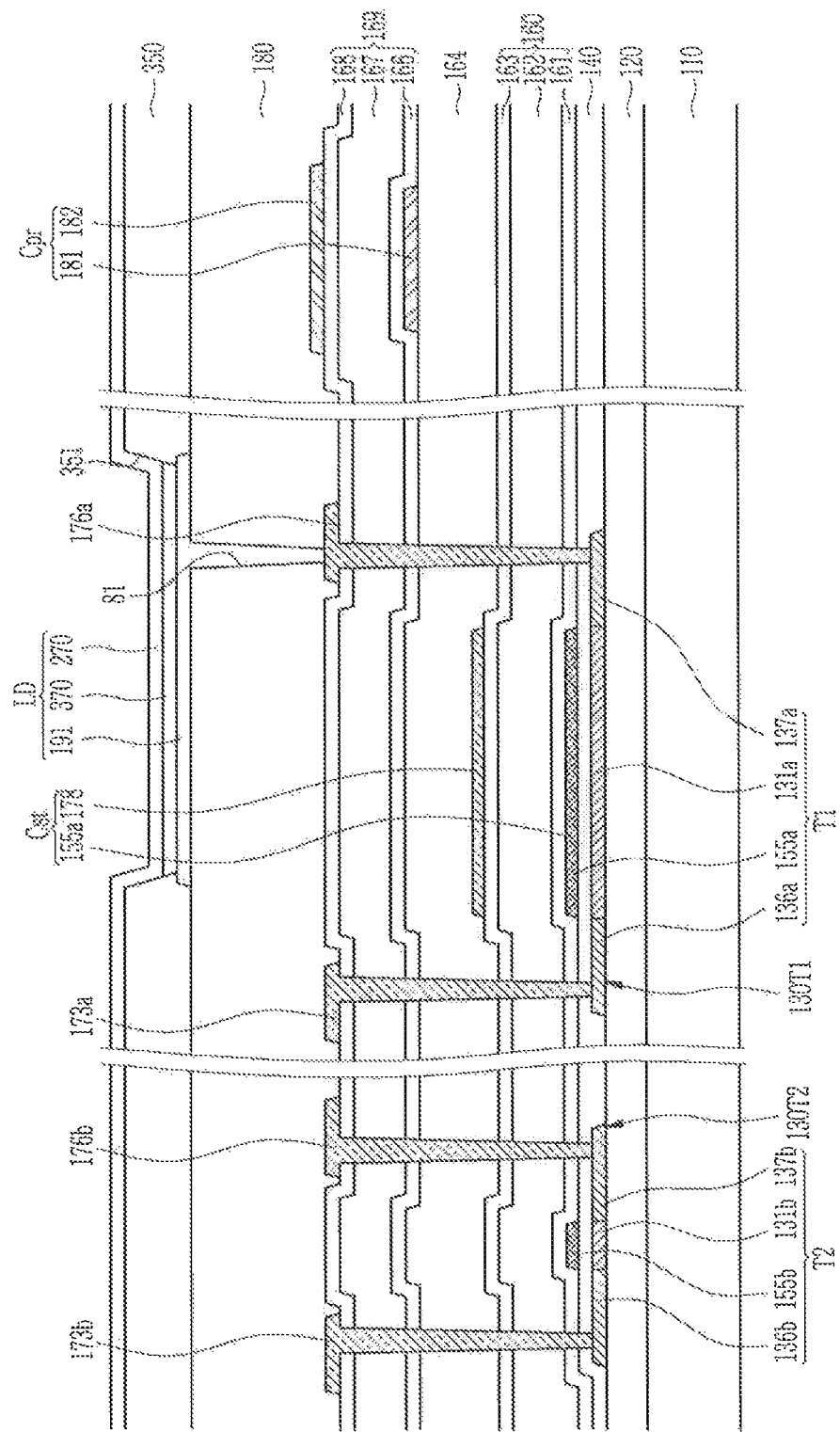
FIG. 12 schematically illustrates a cross-section of the display device of FIG. 11, according to an exemplary embodiment of the present invention.

FIG. 12 schematically illustrates a cross-section of the display device of FIG. 11, according to an exemplary embodiment of the present invention.

Referring to FIG. 12, a buffer layer 120 is disposed on the substrate 110. A driving semiconductor 130T1 and a switching semiconductor 130T2 are disposed on the buffer layer 120.

The driving semiconductor 130T1 includes a driving channel 131a, a driving source electrode 136a, and a driving drain electrode 137a. The driving channel 131a is disposed between the driving source electrode 136a and the driving drain electrode 137a.

The switching semiconductor 130T2 includes a switching channel 131b, a switching source electrode 136b, and a switching drain electrode 137b. The switching channel 131b is disposed between the switching source electrode 136b and the switching drain electrode 137b.

A first insulating layer 140 is disposed on and covers the driving semiconductor 130T1 and the switching semiconductor 130T2, and a driving gate electrode 155a and a switching gate electrode 155b are disposed on the first insulating layer 140. The driving gate electrode 155a overlaps the driving channel 131a, and the switching gate electrode 155b overlaps the switching channel 131b.

A second insulating layer 160 is disposed on the driving gate electrode 155a and the switching gate electrode 155b. A storage electrode 178 is disposed on the second insulating layer 160. The storage electrode 178 overlaps the driving gate electrode 155a.

The second insulating layer 160 constitutes the storage capacitor Cst together with the driving gate electrode 155a and the storage electrode 178, and the second insulating layer 160 is a dielectric material of the storage capacitor Cst.

The second insulating layer 160 includes a first dielectric constant layer 161, a second dielectric constant layer 162, and a third dielectric constant layer 163. The first dielectric constant layer 161 is disposed on the driving gate electrode 155a, the switching gate electrode 155b, and the first insulating layer 140, the second dielectric constant layer 162 is disposed on the first dielectric constant layer 161, and the third dielectric constant layer 163 is disposed on the second dielectric constant layer 162. The first dielectric constant layer 161, the second dielectric constant layer 162, and the third dielectric constant layer 163 may respectively correspond to the first low dielectric constant layer 521, the high dielectric constant layer 522, and the second low dielectric constant layer 523 of FIG. 1.

A dielectric constant of the second dielectric constant layer 162 is greater than a dielectric constant of the first dielectric constant layer 161 and a dielectric constant of the third dielectric constant layer 163. The dielectric constant of the first dielectric constant layer 161 and the dielectric constant of the third dielectric constant layer 163 may be identical to or different from each other. The dielectric constant of the second dielectric constant layer 162 may be equal to or greater than 30. The dielectric constant of the first dielectric constant layer 161 and the dielectric constant of the third dielectric constant layer 163 may be equal to or greater than 6.8.

The first dielectric constant layer 161 and the third dielectric constant layer 163 may include a silicon oxide (SiOx), a silicon nitride (SiNx), or an aluminum oxide ($Al_2O_3$). The second dielectric constant layer 162 may include a zirconium oxide (ZrOx) or a titanium oxide (TiOx). The first dielectric constant layer 161 and the third dielectric constant layer 163 may include a same material.

Thicknesses of the first dielectric constant layer 161 and the third dielectric constant layer 163 may be identical to or different from each other, and a sum of the thicknesses of the first dielectric constant layer 161 and the third dielectric constant layer 163 may be in a range of 40 nm to 70 nm. The thickness of the second dielectric constant layer 162 may be in a range of 50 nm to 70 nm. Accordingly, the thickness of the second insulating layer 160 may be in a range of 90 nm to 140 nm. The thickness of the second dielectric constant layer 162 is greater than the thickness of the first dielectric constant layer 161 and the thickness of the third dielectric constant layer 163.

In the present exemplary embodiment, the structure in which the second insulating layer 160 includes the first dielectric constant layer 161 (e.g., a low dielectric constant layer), the second dielectric constant layer 162 (e.g., a high dielectric constant layer), and the third dielectric constant layer 163 (e.g., a low dielectric constant layer) has been described, but the present invention is not limited thereto. A structure of the capacitor illustrated in FIG. 2 and FIG. 3 may be applied to the second insulating layer 160. For example, the second insulating layer 160 may include just two dielectric layers, e.g., a low dielectric constant layer and a high dielectric constant layer.

A third insulating layer 164 is disposed on the storage electrode 178 and the second insulating layer 160, and an auxiliary capacitor lower electrode 181 is disposed on the third insulating layer 164. A fourth insulating layer 169 is disposed on the auxiliary capacitor lower electrode 181 and the third insulating layer 164, and a driving source connecting member 173a, a switching source connecting member 173b, a driving data connecting member 176a, a switching data connecting member 176b, and an auxiliary capacitor upper electrode 182 are disposed on the fourth insulating layer 169. The auxiliary capacitor upper electrode 182 overlaps the auxiliary capacitor lower electrode 181.

The fourth insulating layer 169 constitutes an auxiliary capacitor Cpr together with the auxiliary capacitor lower electrode 181 and the auxiliary capacitor upper electrode 182, and the fourth insulating layer 169 is a dielectric material of the auxiliary capacitor Cpr.

The fourth insulating layer 169 includes a fourth dielectric constant layer 166, a fifth dielectric constant layer 167, and a sixth dielectric constant layer 168. The fourth dielectric constant layer 166 is disposed on the auxiliary capacitor lower electrode 181 and the third insulating layer 164, the fifth dielectric constant layer 167 is disposed on the fourth dielectric constant layer 166, and the sixth dielectric constant layer 168 is disposed on the fifth dielectric constant layer 167. The fourth dielectric constant layer 166, the fifth dielectric constant layer 167, and the sixth dielectric constant layer 168 may respectively correspond to the first low dielectric constant layer 521, the high dielectric constant layer 522, and the second low dielectric constant layer 523 of FIG. 1.

A dielectric constant of the fifth dielectric constant layer 167 is greater than a dielectric constant of the fourth dielectric constant layer 166 and a dielectric constant of the sixth dielectric constant layer 168. The dielectric constant of the fourth dielectric constant layer 166 and the dielectric constant of the sixth dielectric constant layer 168 may be identical to or different from each other. The dielectric constant of the fifth dielectric constant layer 167 may be equal to or greater than 30. The dielectric constant of the fourth dielectric constant layer 166 and the dielectric constant of the sixth dielectric constant layer 168 may be equal to or greater than 6.8.

The fourth dielectric constant layer 166 and the sixth dielectric constant layer 168 may include a silicon oxide (SiOx), a silicon nitride (SiNx), or an aluminum oxide ($Al_2O_3$). The fifth dielectric constant layer 167 may include a zirconium oxide (ZrOx) or a titanium oxide (TiOx). The fourth dielectric constant layer 166 and the sixth dielectric constant layer 168 may include a same material.

The thickness of the fourth dielectric constant layer 166 and the sixth dielectric constant layer 168 may be identical to or different from each other, and a sum of the thicknesses of the fourth dielectric constant layer 166 and the sixth dielectric constant layer 168 may be in a range of 40 nm to 70 nm. The thickness of the fifth dielectric constant layer 167 may be in a range of 50 nm to 70 nm. Accordingly, the thickness of the fourth insulating layer 169 may be in a range of 90 nm to 140 nm. The thickness of the fifth dielectric constant layer 167 is greater than the thickness of the fourth dielectric constant layer 166 and the thickness of the sixth dielectric constant layer 168.

As such, a capacitance of the auxiliary capacitor Cpr may be increased since the fourth insulating layer 169, which is used as a dielectric material of the auxiliary capacitor Cpr, includes a material of a high dielectric constant.

In addition, it is possible to reduce the leakage current of the display device having the high resolution and increase the breakdown voltage since the fourth insulating layer 169, which is used as a dielectric material of the auxiliary capacitor Cpr, includes the fourth dielectric layer 166 and the sixth dielectric layer 168 each having a low dielectric constant as well as the fifth dielectric layer 167 having a high dielectric constant.

In the present exemplary embodiment, the structure in which the fourth insulating layer 169 includes the fourth dielectric constant layer 166 (e.g., a low dielectric constant layer), the fifth dielectric constant layer 167 (e.g., a high dielectric constant layer), and the sixth dielectric constant layer 168 (e.g., a low dielectric constant layer) has been described, but the present invention is not limited thereto. A structure of the capacitor illustrated in FIG. 2 and FIG. 3 may be applied to the fourth insulating layer 169. For example, the fourth insulating layer 169 may include just two dielectric layers, e.g., a low dielectric constant layer and a high dielectric constant layer.

The driving source connecting member 173a and the driving data connecting member 176a are respectively connected with the driving source electrode 136a and the driving drain electrode 137a, and the switching source connecting member 173b and the switching data connecting member 176b are respectively connected with the switching source electrode 136b and the switching drain electrode 137b.

A passivation layer 180 is disposed on and covers the driving source connecting member 173a, the switching source connecting member 173b, the driving data connecting member 176a, the switching data connecting member 176b, the auxiliary capacitor upper electrode 182, and the fourth insulating layer 169. The passivation layer 180 may include an organic layer.

A pixel electrode 191 connected with the driving data connecting member 176a is disposed on the passivation layer 180.

A pixel definition layer 350 covers edges of the passivation layer 180 and the pixel electrode 191, and the pixel definition layer 350 has a pixel opening 351 overlapping the pixel electrode 191.

An emission member 370 is disposed on the pixel electrode 191 in the pixel opening 351, and a common electrode 270 is disposed on the emission member 370. Accordingly, the light emitting diode LD including the pixel electrode 191, the emission member 370, and the common electrode 270 is formed.

While this invention has been particularly shown and described with reference to exemplary embodiments thereof, it will be understood by those of ordinary skill in the art that various modifications may be made thereto without departing from the spirit and scope of the present invention as defined by the appended claims.

What is claimed is:

1. A display device, comprising:
a substrate;
a semiconductor disposed on the substrate, wherein the semiconductor includes a driving channel;
a first insulating layer disposed on the semiconductor;
a driving gate electrode disposed on the first insulating layer and overlapping the driving channel;
a second insulating layer disposed on the driving gate electrode and the first insulating layer, wherein the second insulating layer includes a first dielectric constant layer, a second dielectric constant layer and a third dielectric constant layer, the second dielectric constant layer having a dielectric constant that is greater than a dielectric constant of the first dielectric constant layer, the third dielectric constant layer having a dielectric constant that is smaller than the dielectric constant of the second dielectric constant layer;
a storage electrode disposed on the second insulating layer;
a passivation layer covering the storage electrode and the second insulating layer;
a pixel electrode disposed on the passivation layer;
an emission member disposed on the pixel electrode; and
a common electrode disposed on the emission member,
wherein the storage electrode overlaps the driving gate electrode,
wherein the storage electrode, the driving gate electrode and the second insulating layer therebetween form a storage capacitor,
wherein the first dielectric constant layer is disposed on a gate wire and the first insulating layer, and the second dielectric constant layer is disposed on the first dielectric constant layer, wherein the dielectric constant of the second dielectric constant layer is equal to or greater than 30, and the dielectric constant of the first dielectric constant layer is equal to or greater than 6.8 and the dielectric constant of the third dielectric constant layer is equal to or greater than 6.8, wherein the second dielectric constant layer includes a zirconium oxide (ZiOx) or a titanium oxide (TiOx), and each of the first dielectric constant layer and the third dielectric constant layer include a silicon oxide (SiOx), a silicon nitride (SiNx), or an aluminum oxide ($Al_2O_3$), and wherein a thickness of the second dielectric constant layer is in a range of 50 nm to 70 nm, and a sum of a thickness of the first dielectric constant layer and a thickness of the third dielectric constant layer is in a range of 40 nm to 70 nm.

2. The display device of claim 1, wherein the third dielectric constant layer and a fourth dielectric constant layer are disposed on the first dielectric constant layer.

3. The display device of claim 1, wherein a plasma treatment layer is disposed between the second dielectric constant layer and the first dielectric constant layer.

4. A display device, comprising:
a substrate;
a semiconductor disposed on the substrate, wherein the semiconductor includes a driving channel;
a first insulating layer disposed on the semiconductor;
a driving gate electrode disposed on the first insulating layer and overlapping the driving channel;
a second insulating layer disposed on the driving gate electrode and the first insulating layer, wherein the second insulating layer includes a first dielectric constant layer and a second dielectric constant layer having a dielectric constant that is greater than a dielectric constant of the first dielectric constant layer;
a storage electrode disposed on the second insulating layer;
a passivation layer covering the storage electrode and the second insulating layer;
a pixel electrode disposed on the passivation layer;
an emission member disposed on the pixel electrode; and
a common electrode disposed on the emission member,
wherein the storage electrode overlaps the driving gate electrode, and
wherein the storage electrode, the driving gate electrode and the second insulating layer therebetween form a storage capacitor, the display device further comprising:
a third insulating layer, an auxiliary capacitor lower electrode, a fourth insulating layer, and an auxiliary capacitor upper electrode disposed between the passivation layer and the second insulating layer,
wherein the third insulating layer is disposed on the storage electrode and the second insulating layer,
the auxiliary capacitor lower electrode is disposed on the third insulating layer,
the fourth insulating layer is disposed on the auxiliary capacitor lower electrode and the third insulating layer,
the auxiliary capacitor upper electrode is disposed on the fourth insulating layer, and
the auxiliary capacitor upper electrode overlaps the auxiliary capacitor lower electrode, and
wherein the auxiliary capacitor upper electrode, the auxiliary capacitor lower electrode and the fourth insulating layer therebetween form an auxiliary capacitor.

5. The display device of claim 4, wherein the fourth insulating layer includes a fourth dielectric constant layer and a fifth dielectric constant layer having a dielectric constant that is greater than a dielectric constant of the fourth dielectric constant layer.

6. The display device of claim 5, wherein the fourth insulating layer further includes a sixth dielectric constant layer having a dielectric constant that is smaller than the dielectric constant of the fifth dielectric constant layer,
the fourth dielectric constant layer is disposed on the auxiliary capacitor lower electrode and the third insulating layer,
the fifth dielectric constant layer is disposed on the fourth dielectric constant layer, and
the sixth dielectric constant layer is disposed on the fifth dielectric constant layer.

7. The display device of claim 6, wherein the dielectric constant of the fifth dielectric constant layer is equal to or greater than 30, and
the dielectric constant of the fourth dielectric constant layer is equal to or greater than 6.8 and the dielectric constant of the sixth dielectric constant layer is equal to or greater than 6.8.

8. The display device of claim 7, wherein the fifth dielectric constant layer includes a zirconium oxide (ZrOx) or a titanium oxide (TiOx), and
each of the fourth dielectric constant layer and the sixth dielectric constant layer include a silicon oxide (SiOx), a silicon nitride (SiNx), or an aluminum oxide ($Al_2O_3$).

9. The display device of claim 8, wherein the fifth dielectric constant layer is thicker than each of the fourth dielectric constant layer and the sixth dielectric constant layer.

10. The display device of claim 9, wherein a thickness of the fifth dielectric constant layer is in a range of 50 am to 70 nm, and
a sum of a thickness of the fourth dielectric constant layer and a thickness of the sixth dielectric constant layer is in a range of 40 nm to 70 nm.

11. The display device of claim 5, wherein the fifth dielectric constant layer is disposed on the auxiliary capacitor lower electrode and the third insulating layer, and
the fourth dielectric constant layer is disposed on the fifth dielectric constant layer.

12. The display device of claim 11, wherein a sixth dielectric constant layer and a seventh dielectric constant layer are disposed on the fourth dielectric constant layer.

13. The display device of claim 11, wherein a plasma treatment layer is disposed between the fifth dielectric constant layer and the fourth dielectric constant layer.

14. A display device, comprising:
a substrate;
a first electrode disposed on the substrate;
a first insulating layer disposed on the first electrode and having a first dielectric constant;
a second insulating layer disposed on the first insulating layer and having a second dielectric constant;
a third insulating layer disposed on the second insulating layer and having a third dielectric constant; and
a second electrode overlapping the first insulating layer, the second insulating layer, the third insulating layer and the first electrode,
wherein a storage capacitor is formed by the first electrode, the second electrode and the first insulating layer, the second insulating layer, and the third insulating layer between the first electrode and the second electrode, wherein the second dielectric constant is greater than the first dielectric constant and the third dielectric constant, wherein the first insulating layer is disposed directly on the first electrode, and the second electrode is disposed directly on the third insulating layer, wherein the second dielectric constant of the second insulating layer is equal to or greater than 30, and the first dielectric constant of the first insulating layer is equal to or greater than 6.8 and the third dielectric constant of the third insulating layer is equal to or greater than 6.8, wherein the second insulating layer includes a zirconium oxide (ZiOx) or a titanium oxide (TiOx), and each of the first insulating layer and the third insulating layer include a silicon oxide (SiOx), a silicon nitride (SiNx), or an aluminum oxide ($Al_2O_3$), and wherein a thickness of the second insulating layer is in a range of 50 nm to 70 nm, and a sum of a thickness of the first insulating layer and a thickness of the third insulating layer is in a range of 40 nm to 70 nm.

15. The display device of claim 14, wherein the first insulating layer, the second insulating layer, and the third insulating layer are sequentially arranged.

\* \* \* \* \*